United States Patent
Yong et al.

(10) Patent No.: US 10,014,229 B2
(45) Date of Patent: Jul. 3, 2018

(54) GENERATING A WAFER INSPECTION PROCESS USING BIT FAILURES AND VIRTUAL INSPECTION

(71) Applicant: KLA-Tencor Corporation, Milpitas, CA (US)

(72) Inventors: Poh Boon Yong, Milpitas, CA (US); George Simon, Livermore, CA (US); Yuezhong Du, San Jose, CA (US)

(73) Assignee: KLA-Tencor Corp., Milpitas, CA (US)

( * ) Notice: Subject to any disclaimer, the term of this patent is extended or adjusted under 35 U.S.C. 154(b) by 329 days.

(21) Appl. No.: 15/041,016

(22) Filed: Feb. 10, 2016

(65) Prior Publication Data

US 2016/0163606 A1  Jun. 9, 2016

Related U.S. Application Data

(63) Continuation of application No. 13/743,074, filed on Jan. 16, 2013, now Pat. No. 9,277,186.

(60) Provisional application No. 61/587,911, filed on Jan. 18, 2012.

(51) Int. Cl.
| | |
|---|---|
| H04N 19/00 | (2014.01) |
| H01L 21/66 | (2006.01) |
| H04N 7/18 | (2006.01) |
| G06T 7/00 | (2017.01) |

(52) U.S. Cl.
CPC .......... *H01L 22/20* (2013.01); *G06T 7/0004* (2013.01); *H01L 22/12* (2013.01); *H01L 22/14* (2013.01); *H04N 7/18* (2013.01); *G06T 2207/30148* (2013.01); *H01L 2924/0002* (2013.01)

(58) Field of Classification Search
CPC ...................................................... H04N 19/00
USPC ............................................... 348/87, 92, 94
See application file for complete search history.

(56) References Cited

U.S. PATENT DOCUMENTS

| | | |
|---|---|---|
| 2009/0080759 A1 | 5/2009 | Bhaskar et al. |
| 2009/0297019 A1 | 12/2009 | Zafar et al. |

FOREIGN PATENT DOCUMENTS

| | | |
|---|---|---|
| JP | 2000-269276 | 9/2000 |
| JP | 2011-501875 | 1/2011 |
| WO | 2009/039486 | 3/2009 |

*Primary Examiner* — Andy Rao
(74) *Attorney, Agent, or Firm* — Ann Marie Mewherter

(57) ABSTRACT

Methods and systems for generating a wafer inspection process are provided. One method includes storing output of detector(s) of an inspection system during scanning of a wafer regardless of whether the output corresponds to defects detected on the wafer and separating physical locations on the wafer that correspond to bit failures detected by testing of the water into a first portion of the physical locations at which the defects were not detected and a second portion of the physical locations at which the defects were detected. In addition, the method includes applying defect detection method(s) to the stored output corresponding to the first portion of the physical locations to detect defects at the first portion of the physical locations and generating a wafer inspection process based on the defects detected by the defect detection method(s) at the first portion of the physical locations.

39 Claims, 3 Drawing Sheets

| Recipe 200 | Parameter 1 202 | Parameter 2 204 | Parameter 3 206 | Bit to Defect Overlay 208 | Verification 216 |
|---|---|---|---|---|---|
| 1 | X | A | P | 214, 212 | No Hit |
| 2 | Y | B | Q | 214, 212, 210 | Hit |
| 3 | Z | C | R | 214, 212 | No Hit |

*Fig. 2*

GENERATING A WAFER INSPECTION PROCESS USING BIT FAILURES AND VIRTUAL INSPECTION

BACKGROUND OF THE INVENTION

1. Field of the Invention

This invention generally relates to methods and systems for generating a wafer inspection process using bit failures and virtual inspection.

2. Description of the Related Art

The following description and examples are not admitted to be prior art by virtue of their inclusion in this section.

Inspection processes are used at various steps during a semiconductor manufacturing process to detect defects on wafers to promote higher yield in the manufacturing process and thus higher profits. Inspection has always been an important part of fabricating semiconductor devices. However, as the dimensions of semiconductor devices decrease, inspection becomes even more important to the successful manufacture of acceptable semiconductor devices because smaller defects can cause the devices to fail.

Some inspection recipes (or a set of instructions used to perform an inspection process) have been generated based on known defects of interest (DOIs). For example, inspection recipes can be set up so that they detect as many DOIs as possible while not detecting other defects not of interest, nuisance, and noise. One problem in setting up inspection recipes in this manner is that it is not always possible to know which DOIs will be killer defects and cause a device to fail. For example, there is currently no simple way to verify if a defect is a killer defect. A user may guess if a defect is a killer defect based on its characteristics such size, classification, and location and based on the defect-related experience of the user. However, the user may not be able to predict which defects will be killer defects with any degree of accuracy or precision. Therefore, it is not always easy or even possible to set up inspection recipes to detect the defects of most interest, killer defects.

Accordingly, it would be advantageous to develop systems and/or methods for generating a wafer inspection process that do not have one or more of the disadvantages described above.

SUMMARY OF THE INVENTION

The following description of various embodiments is not to be construed in any way as limiting the subject matter of the appended claims.

One embodiment relates to a computer-implemented method for generating a wafer inspection process. The method includes scanning a wafer with an inspection system to detect defects on the wafer. The method also includes storing output of one or more detectors of the inspection system during the scanning regardless of whether the output corresponds to the defects detected on the wafer. In addition, the method includes separating physical locations on the wafer that correspond to bit failures detected by testing of the wafer into a first portion of the physical locations at which the defects were not detected and a second portion of the physical locations at which the defects were detected. The method further includes applying one or more defect detection methods to the stored output corresponding to the first portion of the physical locations to detect defects at the first portion of the physical locations. The method also includes generating a wafer inspection process based on the defects detected by the one or more defect detection methods at the first portion of the physical locations. The storing, separating, applying, and generating steps are performed with a computer system.

The method described above may be performed as described further herein. In addition, the method described above may include any other step(s) of any other method(s) described herein. Furthermore, the method described above may be performed by any of the systems described herein.

Another embodiment relates to a non-transitory computer-readable medium storing program instructions executable on a computer system for performing a computer-implemented method for generating a wafer inspection process. The computer-implemented method includes the storing, separating, applying and generating steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

An additional embodiment relates to a system configured to generate a wafer inspection process. The system includes an inspection subsystem configured to scan a wafer to detect defects on the wafer. The system also includes a computer subsystem configured for performing the storing, separating, applying and generating steps of the method described above. The system may be further configured as described herein.

BRIEF DESCRIPTION OF THE DRAWINGS

Other objects and advantages of the invention will become apparent upon reading the following detailed description and upon reference to the accompanying drawings in which:

FIG. 2 is a schematic diagram illustrating three different inspection recipes with three different recipe parameters and results of comparing a bit failure with defect detection results generated by the three different inspection recipes;

Figure 1:
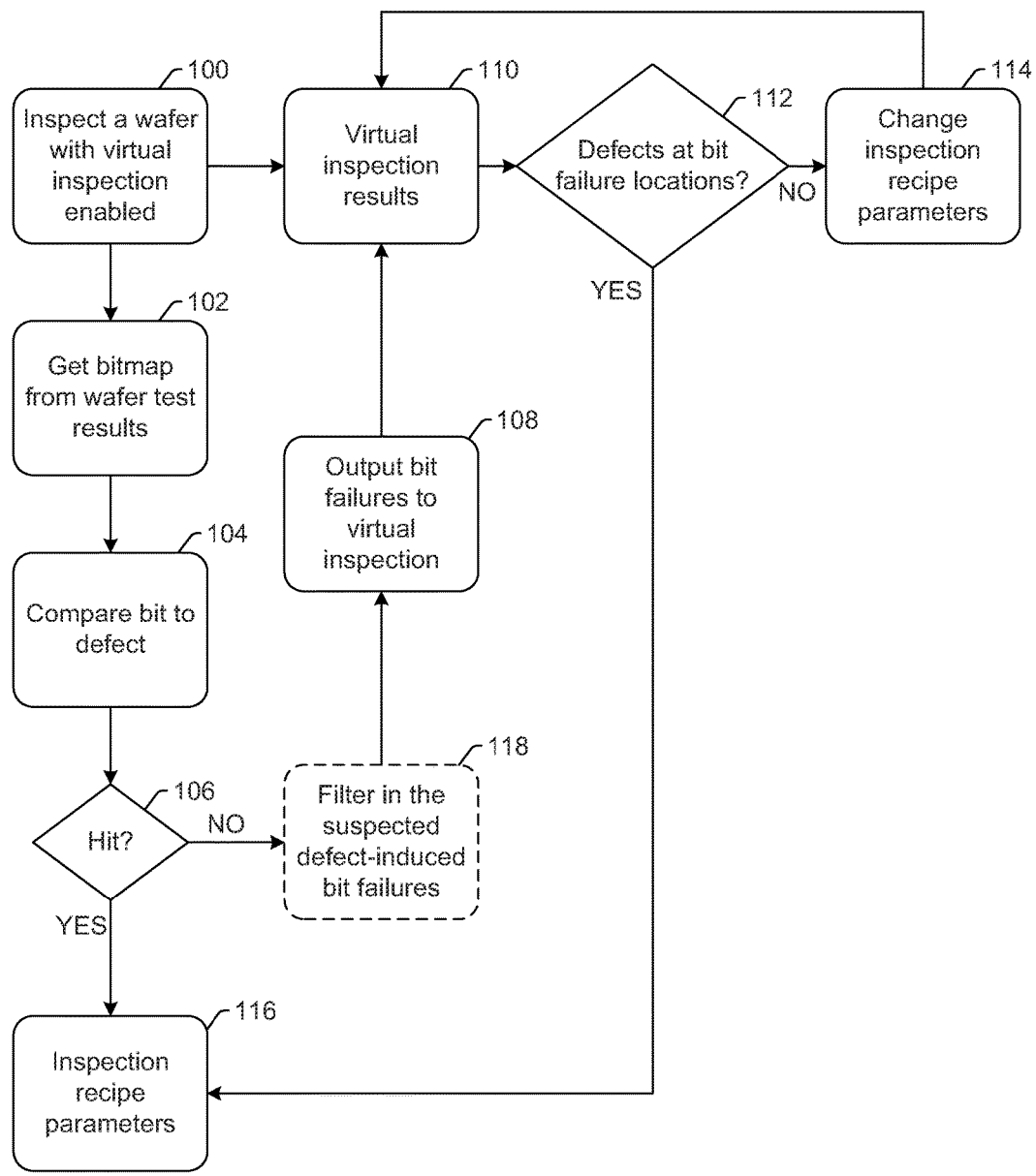
FIG. 1 is a flow chart illustrating one embodiment of a method for generating a wafer inspection process.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals.

One embodiment relates to a computer-implemented method for generating a wafer inspection process. The method includes scanning a wafer with an inspection system to detect defects on the wafer. Scanning the wafer with the inspection system may be performed in any suitable manner. During scanning of the wafer, one or more detectors of the inspection system, which may be configured as described herein, generate output such as signals, image signals, data, image data, etc., that can be used to detect the defects on the wafer. For example, one or more defect detection methods may be applied to the generated output to detect the defects on the wafer. The defects may include any physical defects on the wafer such as particles, pattern defects, and the like.

In one embodiment, the inspection system includes an optical or electron beam inspection system. Such an inspection system may be configured as described further herein. In this manner, the inspection system that is used for the scanning step described above is not an electrical testing system that detects electrical defects on the wafer. Such an electrical testing system may, however, be used to detect bit failures on the wafer as described further herein.

In some embodiments, scanning the wafer includes scanning the wafer with the inspection system after different layers have been formed on the wafer to detect the defects on the different layers. For example, after each layer is formed on the wafer in the wafer fabrication process, an inspection may be performed on the wafer. Each inspection process may be designed for the layer that it will be used to inspect. Therefore, different inspection processes may be performed on the wafer depending on where the wafer is in the fabrication process.

The method also includes storing output of one or more detectors of the inspection system during the scanning regardless of whether the output corresponds to the defects detected on the wafer. In this manner, the method may include inspecting a wafer with virtual inspection enabled, as shown in step 100 of FIG. 1, for one or more different layers formed on the wafer. Enabling virtual inspection may be performed as described in U.S. Pat. No. 8,126,255 issued on Feb. 28, 2012 to Bhaskar et al., which is incorporated by reference as if fully set forth herein. In addition, a system configured to perform a virtual inspection, i.e., a virtual inspector, as described herein may be configured as described in this patent.

The storing step may store the output regardless of whether it corresponds to the defects detected on the wafer in that the output that is stored may include all of the output generated for the wafer during the scanning. For example, unlike most inspection methods in which only the output that corresponds to defects detected on the wafer is stored or in which none of the output may be stored, in virtual inspection, all (or a substantial portion) of the output generated by scanning may be stored such that the output can be used to re-visit locations on the wafer including those at which defects were detected as well as those at which defects were not detected. For example, once the output has been stored as described herein, the stored output may be used to perform an additional inspection of the wafer using the stored output and one or more defect detection methods without using the actual wafer and without performing additional scanning of the wafer. Such an inspection is therefore "virtual" since a physical wafer is not used for the inspection. The output may be stored in the virtual inspector systems described in the above-referenced patent and such a system may be used to perform additional steps described herein. Any other results of the inspection system produced by the inspection of the wafer may also be stored in the same or different storage media as the output and may be used by the methods and systems described herein.

In one embodiment, the wafer is not used for any step of the method other than the scanning step. In particular, since the output generated during the scanning is stored as described above and can be re-used for additional inspections such as those described herein, the wafer is not needed for any other steps described herein. For example, since the one or more defect detection methods can be applied as described herein to the stored output, the wafer does not need to be re-scanned to generate output for the applying step.

The output may also be stored for multiple inspections of the wafer performed for different layers of the wafer. In this manner, the stored output may be used to perform virtual inspections of the wafer when corresponding actual inspections of the physical wafer may no longer be possible. For example, once a layer on the wafer has been formed and inspected, generally, additional layers will be formed on that layer until complete devices have been fabricated thereon. As such, it is typically not possible to go back to an earlier-formed layer and inspect it as though additional layers were not formed on top of that layer. In addition, it is highly undesirable to attempt to remove upper layers on a wafer so that lower layers can be re-inspected. Therefore, using output stored as described herein for virtual inspections of a wafer after wafer fabrication is largely complete and end-of-line testing has been performed may provide inspections that, at that point in fabrication, are otherwise impossible for earlier-formed layers.

The method also includes separating physical locations on the wafer that correspond to bit failures detected by testing of the wafer into a first portion of the physical locations at which the defects were not detected and a second portion of the physical locations at which the defects were detected. For example, after each wafer is inspected throughout the fabrication process, the wafer may be sent to end-of-line wafer sort. During wafer sort, memory is tested to verify the functionality, and bitmap failures are captured during this functional testing of the wafer. If a bit failed, the bit location will be captured. The exact locations of the failed bits can then be identified from the results of the testing of the wafer. Those bit failure locations and information about the locations of defects detected on the wafer can then be used to determine if a defect detected on the wafer corresponds to any of the bit failures, which can be performed in a number of different manners as described herein. In this manner, different locations on the wafer can be sorted into a first portion at which defects were detected that correspond to bit failures and a second portion at which defects that correspond to the bit failures were not detected.

In one embodiment, the method includes determining the physical locations on the wafer that correspond to the bit failures based on results of the testing. For example, as shown in step 102 of FIG. 1, the method may include getting the bitmap from wafer test results (e.g., wafer sort test results). Once the bitmap data is available, the bit locations can be translated to physical coordinates (wafer coordinates) using any suitable method and/or algorithm. Therefore, the bit failure locations and the defect locations can be compared in the physical coordinates of the wafer to determine which bit failures have corresponding defects detected on the wafer. In addition, the method may not include determining the physical locations corresponding to the bit failures but may acquire such information from another system or method that generated the information.

In some embodiments, separating the physical locations includes comparing coordinates of the defects reported by the inspection system to coordinates of the physical locations. For example, once the coordinates of the physical locations corresponding to the bit failures have been determined (either by the embodiments described herein or by some other method and/or system), those coordinates may be compared to the defect coordinates determined and reported by the inspection system. Physical locations corresponding to bit failures having coordinates that match the defect coordinates may then be designated as the second portion of the physical locations, and physical locations corresponding to the bit failures having coordinates that do not match any of the defect coordinates may be designated as the first portion of the physical locations. In addition, the physical location coordinates and defect coordinates may be determined to "match" in any of the comparisons described herein even if the two coordinates do not match exactly (e.g., if the coordinates match within some predetermined margin of error to allow for errors in the reported coordinates and the translating of one set of coordinates to the other and for inherent variability in location and size of bit failure-causing defects).

In another embodiment, separating the physical locations includes converting coordinates of the defects reported by the inspection system to a bitmap domain and comparing bitmap domain coordinates of the bit failures to bitmap domain coordinates of the defects detected by the inspection system. For example, the embodiments described herein can be used to perform relatively high resolution bit to defect overlay where the defect is converted to the bitmap domain to accurately overlay with actual bit failures. The defect coordinates reported by the inspection system may be converted to the bitmap domain in any suitable manner using any suitable method and/or algorithm. In this manner, the physical locations may be separated using bitmap domain coordinates, which may be further performed as described above with respect to physical location coordinates. As such, the physical locations may be separated using bitmap domain coordinates or defect or wafer coordinates.

The bitmap failures may, therefore, be compared to the defect locations reported by the inspection system in a number of different manners. For example, as shown in step 104 of FIG. 1, the method may include comparing bits to defects and, as shown in step 106, the method may include using the results of the comparing step to determine if there is a hit between a defect and a bit failure. Defects detected by the inspection system that correspond to the bit failures may be identified and labeled as killer defects since they caused a failure in a device. For example, defects that have been verified as a hit by doing bit-to-defect overlay may be considered to be killer defects. The locations of those defects then become the second portion of the physical locations described herein. For any bit failures for which a corresponding physical defect cannot be identified by such a comparison, the physical locations corresponding to those bit failures may be included in the first portion of the physical locations described herein. In this manner, as described further herein, those bit failures that do not have a hit and yet exhibit defect-induced bit failures may be sent to the virtual inspector as hot spots.

As described above, different layers on the wafer may be scanned by the inspection system, and the output generated for each of the different layers may be stored in a virtual inspector. In one such embodiment, the physical locations include physical locations on at least two of the different layers. In such embodiments, the separating step may include overlaying bit to defect for different layers and recipe settings. For example, the defects that are compared to the bit failures as described herein may include any defects detected on the wafer that may have caused the bit failures regardless of the layer on which the defects were detected. Therefore, when determining if a defect corresponds to a bit failure, the defects that are considered may include all defects detected on all inspected layers of the wafer.

The method also includes applying one or more defect detection methods to the stored output corresponding to the first portion of the physical locations to detect defects at the first portion of the physical locations. In this manner, the method may include performing a virtual inspection using the stored data to attempt to detect defects that have caused the bit failures and were not detected during the inspection. Applying one or more defect detection methods to the stored output may be performed just as defect detection would be performed during an actual inspection of the wafer. For example, one or more defect detection algorithms may be applied to the stored output, and information for any defects detected as a result may be stored in some manner. More than one defect detection method may typically be applied to the stored output in this step since the results of this step will be used as described further herein to evaluate the performance of different defect detection methods and to generate a wafer inspection process based on those evaluations. In addition, unlike inspection that would normally be performed by the inspection system (detecting defects at all wafer locations at which output has been generated), the embodiments described herein may apply the defect detection method(s) to only the first portion of the physical locations. In this manner, instead of performing a layer inspection, the embodiments described herein may perform a number of discrete "spot" inspections. However, the applying step may include applying the one or more defect detection methods to all of the stored output for one or more of the different inspected layers on the wafer.

In one embodiment, the one or more defect detection methods include the same defect detection algorithm with different values for one or more parameters of the same defect detection algorithm. For example, the defect detection methods may include the same defect detection algorithm with different values for a threshold of the algorithms. In another embodiment, the one or more defect detection methods include different defect detection algorithms. For example, the defect detection methods may include defect detection algorithms that have different functions and different parameters. In some embodiments, a first of the one or more defect detection methods uses the output generated by a first set of the one or more detectors, and a second of the one or more defect detection methods uses the output generated by a second set of the one or more detectors that is different than the first set. For example, the defect detection methods may be the same defect detection algorithm (which may or may not have different values for one or more parameters) but using different inputs to the defect detection algorithm in the form of stored output that was produced by different detectors. Alternatively, the defect detection methods may include different defect detection algorithms that use the output produced by different detectors. In this manner, the embodiments may use the results of the applying step to evaluate the suitability of different detectors of the same inspection system for use in detecting bit failure-causing defects. Each of the first and second sets of detector(s) may include one or more detectors.

In one embodiment, the method includes storing information for the first portion of the physical locations as hot spots for the applying step. For example, as shown in step 108 of FIG. 1, the method may include outputting bit failures to virtual inspection. In particular, the method may include outputting or sending the bit failures or some of the bit failures to virtual inspection as hot spots with physical coordinates. As such, the embodiments described herein may use bitmap as hot spots for a virtual inspector. In addition, the bitmap failures may be used as one of the hot spot sources for virtual inspection. In particular, as described herein, the bitmap may be used to determine the first portion of the physical locations at which defects were not detected by the inspection system. That portion of the physical locations may then be designated as the hot spots for the virtual inspection(s) performed with the stored data in the applying step. In addition, the method may include providing bit to defect overlay results (hit and non-hit failures) to the virtual inspector as hot spots. In this manner, the applying step may perform a number of discrete "spot" inspections at only the hot spots determined from the bit failures.

The applying step may, as described above, function as a virtual inspector using 1) the results of step 100, in which a wafer was inspected with virtual inspection enabled, and 2) the outputted bit failures to virtual inspection of step 108 to produce virtual inspection results shown in step 110. In this manner, potential locations of killer defects may be used as the hot spots for virtual inspection. In addition, as shown in step 112 of FIG. 1, the method may include using the virtual inspection results to determine if there are defects at bit failure locations. As such, the locations at which defects may have been missed during inspection(s) performed by the inspection system may be revisited using the stored data on the virtual inspector such that the defects that caused the bit failures can be discovered or identified. Since such defects are killer defects (because they caused the bit failures in one embodiment, the method includes designating the defects detected by the one or more defect detection methods at the first portion of the physical locations as killer defects, which may be performed in any suitable manner.

In contrast to the embodiments described herein, currently, known DOIs may be used as hot spots for inspections including virtual inspections. However, as noted above, whether or not a defect is a killer defect is not simple to verify. A killer defect may be identified from DOI based on experience and defect characteristics such as size, classification, and location. However, since the DOI cannot be verified, inspections performed using such hot spots will not be accurate and are not entirely scientific.

In another embodiment, applying the defect detection method(s) includes altering one of the one or more defect detection methods that is applied to the stored output depending on the defects detected by applying another of the one or more defect detection methods to the stored output. For example, as shown in step 114 of FIG. 1, if defects are not detected at bit failure locations, the method may include changing the inspection recipe parameters (i.e., changing the parameters of the defect detection method used to produce the virtual inspection results). In this manner, the applying step may include iteratively applying the defect detection method(s), comparing the defects to the bit failures, and changing one or more parameters of the defect detection method(s) until defects are detected at the bit failure locations. The one or more parameters of the defect detection method(s) that are changed may include any of the defect detection algorithm parameters described herein, the defect detection algorithm itself, or the input to the defect detection algorithm (e.g., using output produced by a different detector as input to the defect detection algorithm).

In some such embodiments, the applying step and generating a wafer inspection process described further herein may be performed by a user. For example, in some embodiments, the method includes acquiring input from a user for the one or more defect detection methods. In particular, a user or engineer can use information about the hot spots described above to fine tune the inspection parameters on the virtual inspector. In this manner, on a virtual inspector, the engineer can change inspection recipe parameters to discover defects on the locations of the bit failures.

The method also includes generating a wafer inspection process based on the defects detected by the one or more defect detection methods at the first portion of the physical locations. As shown in step 116 of FIG. 1, for example, the method may include generating inspection recipe parameters based on the hits identified in step 106 and the defect detection method(s) used to detect defects at bit failure locations identified in step 112. For example, the defects that were detected by each of the defect detection method(s) used in the applying step may be evaluated to determine which of the defect detection method(s) is most successful in detecting defects that were missed by the inspection system. The defect detection method(s) that were most successful may be selected for inclusion in the wafer inspection process.

Since defects that are detected by the defect detection method(s) in the applying step will be located at physical locations corresponding to bit failures, the defects detected in the applying step will mostly include killer defects. In this manner, the detection method(s) can be selected based on the killer defects that were or can be detected by each of the defect detection method(s). As such, the embodiments described herein can generate inspection recipe parameters that capture the most killer defects.

Generating a wafer inspection process may also include altering an already existing inspection process (such as the inspection process used by the inspection system to detect the defects on the wafer during the scanning). As such, generating the wafer inspection process may be used to optimize an inspection recipe to capture killer defects. However, the wafer inspection process may be a newly generated inspection process (e.g., a wafer inspection process created "from scratch"). In addition, generating the wafer inspection process may include generating an actual inspection recipe (where the term "recipe" refers to a set of instructions that can be used by a system to perform a process) or simply generating information that can be used by another system or method to generate the actual inspection recipe.

The storing, separating, applying, and generating steps are performed with a computer system, which may be configured as described further herein.

As described above, different layers of the wafer may be scanned, and the physical locations may be on at least two of the different layers. In one such embodiment, the wafer inspection process is generated for one or more of the different layers. For example, since the virtual inspections can be performed on different layers, defects that have caused the bit failures may be detected by the virtual inspections on different layers. The wafer inspection process generating step may take that information into consideration to generate or alter different inspection processes for different layers. Therefore, the term "wafer inspection process" as used herein refers to any combination of one or more of all of the inspections that may be performed on the wafer at different times and on different layers throughout the entire wafer fabrication process. As such, the embodiments described herein can optimize an inspection process for any layer on a wafer such that regardless of the layer a bit failure-causing defect is located on, it can be detected. Consequently, the output of the wafer inspection process generating step may include more than one inspection recipe for more than one wafer layer.

In one embodiment, generating the wafer inspection process includes selecting at least one of the one or more defect detection methods for the wafer inspection process and at least one of the one or more detectors that will be used to generate output during the wafer inspection process that will be input to the at least one of the one or more defect detection methods. For example, as described above, the applying step may be performed such that the suitability of multiple detectors for use in detecting bit failure-causing defects may be evaluated. In this manner, the generating step may include not only selecting defect detection method(s) for the wafer inspection process but also selecting detector(s) whose output will be used for the wafer inspection process. The generating step may select all of the detectors or only a subset of the detector(s) included in an inspection system for use in the wafer inspection process. In addition, the generating step may determine that different detector(s) or different subsets of detectors should be used with different defect detection algorithms. In this manner, the wafer inspection process may be generated by selecting among: 1) different defect detection methods that are applied to: a) the output in the actual inspection process(es); and b) the stored output in the virtual inspection process(es); as well as 2) any different optical parameters that were used to generate the stored output. For example, some of the stored output may also have been generated using different illumination parameters, and the method may determine which of the illumination parameters are most suitable for use in the wafer inspection process based on results of the applying step.

In some embodiments, generating the wafer inspection process includes generating the wafer inspection process based on the defects detected by the one or more detect detection methods at the first portion of the physical locations in combination with the defects detected on the wafer by the inspection system at the second portion of the physical locations. For example, as described above, the method may include generating inspection recipe parameters based on the defect detection method(s) used to detect the hits in the defects detected by the inspection system and the detect detection method(s) used to detect defects at bit failure locations in the virtual inspection. In one such example, the defect detection method(s) that detected the hits and the defect detection method(s) that detected the defects at the bit failure locations in the virtual inspection may both be selected for use in the wafer inspection process.

In another embodiment, applying the defect detection method(s) includes applying the one or more defect detection methods to the stored output corresponding to the first and second portions of the physical locations to detect the defects at the first and second portions of the physical locations. For example, in an optional step shown as step 118 in FIG. 1, the method may include filtering in the suspected defect-induced bit failures. In particular, the defects identified as suspects for inducing the bit failures in step 106 may be considered in the virtual inspection by sending the locations of those defects along with the hot spots to the virtual inspection. In this manner, the physical locations at which defects were detected and are suspected to have caused bit failures may be sent to the virtual inspection with the physical locations at which defects were not detected. In one such embodiment, generating the wafer inspection process includes generating the wafer inspection process based on the defects detected by the one or more defect detection methods at the first and second portions of the physical locations. For example, the virtual inspection(s) can perform defect detection at all locations of the bit failures to try to maximize the total number of killer defects that can be detected by the wafer inspection process that is generated by the embodiments.

The table shown in FIG. 2 illustrates one example of how the killer defect verification process may be performed. In this example, recipes 200 including three recipes (Recipes 1, 2, and 3) are different inspection recipes with different settings for at least one of parameters 202, 204, and 206. Recipes 1, 2, and 3 may, therefore, be the defect detection methods that are evaluated as described further herein. As shown in FIG. 2, Recipe 1 may include value X for Parameter 1, value A for Parameter 2, and value P for Parameter 3. Recipe 2 may include value Y for Parameter 1, value B for Parameter 2, and value Q for Parameter 3. Recipe 3 may include value Z for Parameter 1, value C for Parameter 2, and value R for Parameter 3. In such an example, the values X, Y, and Z for Parameter 1 may be different from each other while the values A, B, and C for Parameter 2 may be the same and the values P, Q, R for Parameter 3 may be the same. Of course, any other combination of different and the same values for the parameters may be used and evaluated in the embodiments described herein. Although only 3 parameters are shown in FIG. 2, the recipes may include any suitable number of parameters (more or less than that shown).

When an inspected wafer is tested (e.g., by a wafer sort function test), the bit failures may be used to overlay with the inspected defects as described further herein, which may produce Bit to Defect Overlay results 208. Since bit failure is a yield loss, defects at the same (or substantially the same) location/coordinates will be considered a killer defect. In the example shown in FIG. 2, Recipe 2 has a hit because there is a defect (e.g., defect 210) on the exact location as bit failure 212 as shown in map 214 that shows the locations of the defects and bit failures in some common coordinate system (e.g., bitmap coordinates or physical wafer or inspection system coordinates). Recipes 1 and 3 have no hit because no defects are discovered at or near the location of the bit failure. The results of the bit to defect overlay may also be outputted as verification 216, which as shown in FIG. 2 includes "No Hit" results for Recipes 1 and 3 and "Hit" results for Recipe 2. Hence, one can conclude that Recipe 2 has the best settings to capture killer defects. In this manner, the embodiments described herein can be used to help defect engineers to set up the best inspection recipes to capture killer defects and monitor yield excursions.

Each of the embodiments of the method described above may include any other step(s) of any other method(s) described herein. Furthermore, each of the embodiments of the method described above may be performed by any of the systems described herein.

All of the methods described herein may include storing results of one or more steps of the method embodiments in a computer-readable storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc.

Figure 3:
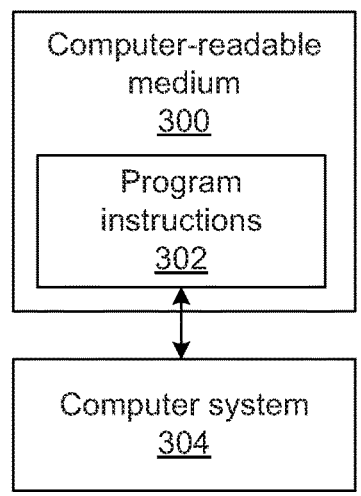
FIG. 3 is a block diagram illustrating one embodiment of a non-transitory computer-readable medium that includes program instructions executable on a computer system for performing one or more of the computer-implemented methods described herein.

An additional embodiment relates to a non-transitory computer-readable medium storing program instructions executable on a computer system for performing a computer-implemented method for generating a wafer inspection process. One such embodiment is shown in FIG. 3. In particular, as shown in FIG. 3, computer-readable medium 300 includes program instructions 302 executable on computer system 304. The computer-implemented method includes the storing, separating, applying, and generating steps of the method described above. The computer-implemented method for which the program instructions are executable may include any other step(s) described herein.

Program instructions 302 implementing methods such as those described herein may be stored on computer-readable medium 300. The computer-readable medium may be a storage medium such as a magnetic or optical disk, or a magnetic tape or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired.

The computer system may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer system may also include any suitable processor known in the art such as a parallel processor. In addition, the computer system may include a computer platform with high speed processing and software, either as a standalone or a networked tool.

Figure 4:
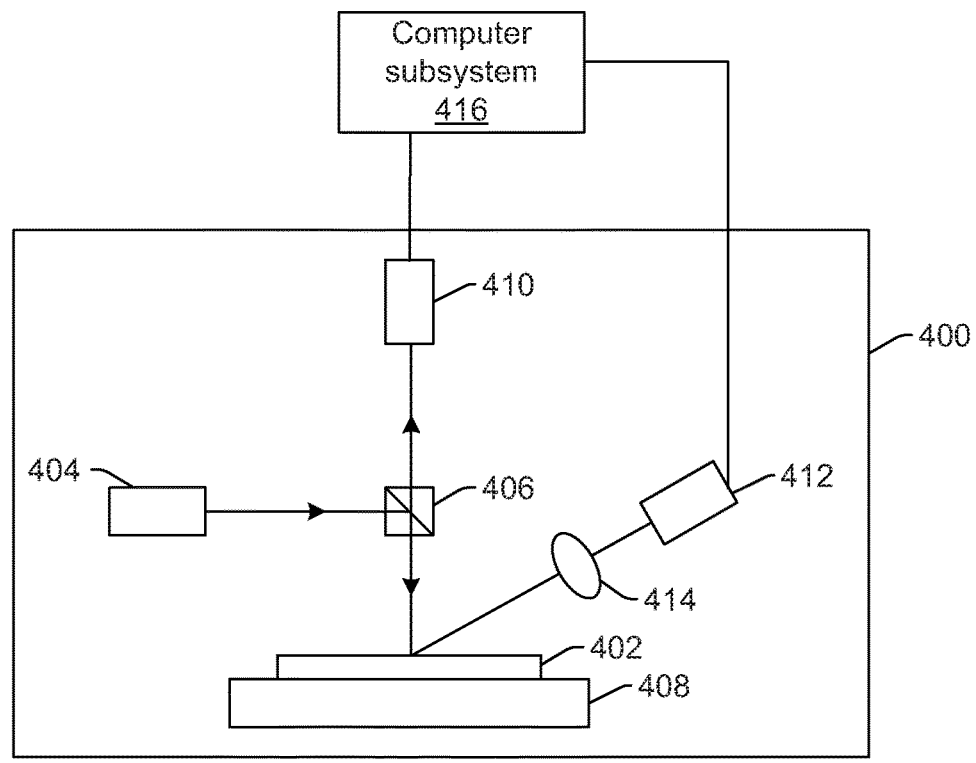
FIG. 4 is a schematic diagram illustrating a side view of one embodiment of a system configured to generate a wafer inspection process.

An additional embodiment relates to a system configured to generate a wafer inspection process. One embodiment of such a system is shown in FIG. 4. The system includes inspection subsystem 400 configured to scan wafer 402 to detect defects on the wafer. The inspection subsystem includes source 404 that may include any suitable light source in the case of an optical or light-based inspection subsystem or any suitable electron beam source in the case of an electron beam-based inspection subsystem. Although the inspection subsystem will be described further herein with respect to a light-based inspection subsystem, the inspection subsystem may be modified in any suitable manner to make it an electron beam-based inspection subsystem.

Light from the light source may be directed to beam splitter 406, which is configured to direct the light to wafer 402. Therefore, the light source and the beam splitter may form an illumination subsystem of the inspection subsystem, which may include any other suitable elements (not shown) such as one or more condensing lenses, collimating lenses, relay lenses, objective lenses, apertures, spectral filters, polarizing components and the like. As shown in FIG. 4, the light may be directed by the beam splitter to the wafer at a normal angle of incidence. However, the light may be directed to the wafer at any suitable angle of incidence including near normal incidence and oblique incidence. In addition, the light or multiple light beams may be directed to the wafer at more than one angle of incidence sequentially or simultaneously.

Wafer 402 is disposed upon stage 408 while the light is being directed to the wafer. The stage may include any suitable mechanical or robotic assembly and may be configured to move the wafer in one or more directions while the light is being directed to the wafer is such that the light can be scanned over the wafer by the inspection subsystem. However, the inspection subsystem may be configured to scan the light over the wafer in any other suitable manner.

The inspection subsystem also includes detector 410 configured to detect light reflected from the wafer that is passed through beam splitter 406. Detector 410 may include any suitable detector. Detector 410 and beam splitter 406 may therefore form at least a portion of a detection subsystem of the inspection subsystem. The detection subsystem may include one or more other suitable elements (not shown) positioned in the optical path between the detector and the wafer such as objective lenses, relay lenses, magnification lenses, zooming lenses, apertures, spectral filters, gratings, and polarizing components. Since the detector detects reflected light from the wafer, the inspection subsystem may be configured for bright field (BF) inspection of the wafer.

The inspection subsystem may also include more than one detector, which may be used to detect different light from the wafer simultaneously or sequentially. For example, as shown in FIG. 4, the inspection subsystem may include detector 412 that detects light scattered from the wafer and collected by lens 414. Detector 412 may include any suitable detector, and lens 414 may include any suitable lens. Detector 412 and lens 414 therefore form at least a portion of a detection subsystem of the inspection subsystem. This detection subsystem may also include one or more other suitable elements (not shown) such as those described above positioned in the optical path between detector 412 and wafer 402. Since the detector detects scattered light from the wafer, the inspection subsystem may be configured for dark field (DF) inspection of the wafer.

The inspection subsystem may therefore be configured for BF and DF inspection, which may be performed sequentially or simultaneously. In addition, the inspection subsystem may include additional detectors (not shown) that may form additional detection subsystems, which may be configured to detect reflected or scattered light from the wafer.

The system also includes computer subsystem 416 configured for performing the storing, separating, applying, and generating steps described herein, which may be performed as described herein. For example, computer subsystem 416 may be coupled to detectors 410 and 412 by one or more transmission media (not shown), which may include "wired" and/or "wireless" transmission media such that the computer subsystem can receive the output of the one or more detectors of the inspection subsystem. The computer subsystem may then use the output to detect defects on the wafer and may store the output as described herein. Alternatively, the inspection subsystem may include one computer subsystem that is configured to detect the defects on the wafer, and the system may include another, different computer subsystem that is configured to store the output of the detector(s) during scanning as described herein. Therefore, one of the computer subsystems may be used for defect detection while the other computer subsystem may be configured and used as a virtual inspector as described herein. The computer subsystem and the system may be configured to perform any other step(s) described herein and may be further configured as described herein. The computer subsystem may also be further configured as described in the above-referenced patent by Bhaskar et al.

It is noted that FIG. 4 is provided herein to generally illustrate one configuration of an inspection subsystem that may be included in the system embodiments described herein. Obviously, the inspection subsystem configuration described herein may be altered to optimize the performance of the inspection subsystem as is normally performed when designing a commercial inspection system. In addition, the systems described herein may be implemented using an existing inspection system (e.g., by adding functionality described herein to an existing inspection system such as the Puma 90xx, 91xx, and 93xx series of tools that are commercially available from KLA-Tencor, Milpitas, Calif. For some such systems, the methods described herein may be provided as optional functionality of the system (e.g., in addition to other functionality of the system). Alternatively, the system described herein may be designed "from scratch" to provide a completely new system.

Further modifications and alternative embodiments of various aspects of the invention will be apparent to those skilled in the art in view of this description. For example, methods and systems for generating a wafer inspection process using bit failures and virtual inspection are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to generate a wafer inspection process, comprising:
   an inspection subsystem configured to scan a wafer to detect defects on the wafer; and
   one or more computer subsystems configured for:
      storing output of one or more detectors of the inspection subsystem during the scanning regardless of whether the output corresponds to the defects detected on the wafer;
      separating physical locations on the wafer that correspond to bit failures detected by testing of the wafer into a first portion of the physical locations at which the defects were not detected and a second portion of the physical locations at which the defects were detected;
      storing information for the first portion of the physical locations as hot spots;
      applying one or more defect detection methods to the stored output corresponding to the first portion of the physical locations to detect defects at the first portion of the physical locations, wherein said applying comprises iteratively applying the one or more defect detection methods to the stored output corresponding to the first portion of the physical locations, comparing the defects detected at the first portion of the physical locations to the bit failures, and changing one or more parameters of the one or more defect detection methods until the defects are detected at the first portion of the physical locations; and
      generating a wafer inspection process based on the defects detected by the one or more defect detection methods at the first portion of the physical locations.

2. The system of claim 1, wherein said separating comprises determining if the defects detected on the wafer correspond to any of the bit failures using locations of the bit failures and information about the physical locations of the defects detected on the wafer.

3. The system of claim 1, wherein said separating is performed using bitmap domain coordinates.

4. The system of claim 1, wherein said separating is performed using defect or wafer coordinates.

5. The system of claim 1, wherein at least one of the one or more computer subsystems is further configured as a virtual inspector.

6. The system of claim 1, wherein at least one of the one or more computer subsystems is further configured as a virtual inspector, and wherein the one or more computer subsystems are further configured for sending the hot spots to the virtual inspector.

7. The system of claim 1, wherein the inspection subsystem or the one or more computer subsystems perform an inspection for the wafer by detecting the defects on the wafer using the output generated by the scanning, and wherein said applying further comprises performing a virtual inspection using the stored output to attempt to detect the defects that have caused the bit failures and were not detected during the inspection.

8. The system of claim 1, wherein said applying does not comprise a layer inspection, and wherein said applying further comprises performing a number of discrete spot inspections at the first portion of the physical locations.

9. The system of claim 1, wherein at least one of the one or more computer subsystems is further configured as a virtual inspector, and wherein the one or more computer subsystems are further configured for sending the bit failures corresponding to the first portion of the physical locations to the virtual inspector as the hot spots with physical coordinates corresponding to the physical locations in the first portion thereby using bitmap as the hot spots for the virtual inspector.

10. The system of claim 1, wherein at least one of the one or more computer subsystems is further configured as a virtual inspector, and wherein the one or more computer subsystems are further configured for sending the bit failures corresponding to the first portion of the physical locations to the virtual inspector as the hot spots with physical coordinates corresponding to the physical locations in the first portion thereby using bitmap failures as one source of the hot spots for a virtual inspection performed by the virtual inspector.

11. The system of claim 1, wherein storing the information comprises storing information for the first and second portions of the physical locations as the hot spots, and wherein said applying further comprises performing a number of discrete spot inspections at only the hot spots.

12. The system of claim 1, wherein said applying further comprises fine tuning inspection parameters comprising the one or more parameters of the one or more defect detection methods on at least one of the one or more comp subsystems configured as a virtual inspector.

13. The system of claim 1, wherein said applying further comprises performing a virtual inspection for the wafer at the first portion of the physical locations using the stored output, and wherein said generating comprises generating recipe parameters for the wafer inspection process based on one or more other defect detection methods used to detect the defects at the second portion of the physical locations and the one or more defect detection methods used to detect the defects at the first portion of the physical locations in the virtual inspection.

14. The system of claim 1, wherein said applying further comprises performing a virtual inspection for the wafer, and wherein the one or more computer subsystems are further configured for sending the hot spots and the second portion of the physical locations at which the defects were detected to the virtual inspection.

15. The system of claim 1, wherein said applying further comprises performing a virtual inspection for the wafer, and wherein the one or more computer subsystems are further configured for sending the second portion of the physical locations at which the defects were detected and are suspected to have caused the bit failures to the virtual inspection with the first portion of the physical locations at which the defects were not detected.

16. The system of claim 1, wherein the inspection subsystem is further configured for bright field inspection of the wafer.

17. The system of claim 1, wherein the inspection subsystem is further configured for dark field inspection of the wafer.

18. The system of claim 1, wherein the inspection subsystem is further configured for bright field and dark field inspection.

19. The system of claim 1, wherein the inspection subsystem is further configured for bright field and dark field inspection, and wherein the bright field and dark field inspection are performed sequentially.

20. The system of claim 1, wherein the inspection subsystem is further configured for bright field and dark field inspection, and wherein the bright field and dark field inspection are performed simultaneously.

21. The system of claim 1, wherein the wafer is not used for any step performed by the one or more computer subsystems.

22. The system of claim 1, wherein the one or more computer subsystems are further configured for determining the physical locations on the wafer that correspond to the bit failures based on results of the testing.

23. The system of claim 1, wherein the inspection subsystem comprises an optical or electron beam inspection subsystem.

24. The system of claim 1, wherein the one or more computer subsystems are further configured for designating the defects detected by the one or more defect detection methods at the first portion of the physical locations as killer defects.

25. The system of claim 1, wherein said separating comprises comparing coordinates of the defects reported by the inspection subsystem to coordinates of the physical locations.

26. The system of claim 1, wherein said separating comprises converting coordinates of the defects reported by the inspection subsystem to a bitmap domain and comparing bitmap domain coordinates of the bit failures to bitmap domain coordinates of the defects detected by the inspection subsystem.

27. The system of claim 1, wherein the one or more computer subsystems are further configured for using the stored information for the first portion of the physical locations as the hot spots for the applying step.

28. The system of claim 1, wherein said applying further comprises altering one of the one or more defect detection methods that is applied to the stored output depending on the defects detected by applying another of the one or more defect detection methods to the stored output.

29. The system of claim 1, wherein the inspection subsystem is further configured to scan the wafer after different layers have been formed on the wafer to detect the defects on the different layers, wherein the physical locations comprise physical locations on at least two of the different layers, and wherein the wafer inspection process is generated for one or more of the different layers.

30. The system of claim 1, wherein the one or more computer subsystems are further configured for acquiring input from a user for the one or more defect detection methods.

31. The system of claim 1, wherein the one or more defect detection methods comprise the same defect detection algorithm with different values for the one or more parameters of the same defect detection algorithm.

32. The system of claim 1, wherein the one or more defect detection methods comprise different defect detection algorithms.

33. The system of claim 1, wherein a first of the one or more defect detection methods uses the output generated by a first set of the one or more detectors, and wherein a second of the one or more defect detection methods uses the output generated by a second set of the one or more detectors that is different than the first set.

34. The system of claim 1, wherein generating the wafer inspection process comprises selecting at least one of the one or more defect detection methods for the wafer inspection process and at least one of the one or more detectors that will be used to generate output during the wafer inspection process that will be input to the at least one of the one or more defect detection methods.

35. The system of claim 1, wherein said generating comprises generating the wafer inspection process based on the defects detected by the one or more defect detection methods at the first portion of the physical locations in combination with the defects detected on the wafer by the inspection system at the second portion of the physical locations.

36. The system of claim 1, wherein said applying further comprises applying the one or more defect detection methods to the stored output corresponding to the first and second portions of the physical locations to detect the defects at the first and second portions of the physical locations.

37. The system of claim 36, wherein said generating comprises generating the wafer inspection process based on the defects detected by the one or more defect detection methods at the first and second portions of the physical locations.

38. A computer-implemented method for generating a wafer inspection process, comprising:
scanning a wafer with an inspection system to detect defects on the wafer;
storing output of one or more detectors of the inspection system during the scanning regardless of whether the output corresponds to the defects detected on the wafer;
separating physical locations on the wafer that correspond to bit failures detected by testing of the wafer into a first portion of the physical locations at which the defects were not detected and a second portion of the physical locations at which the defects were detected;
storing information for the first portion of the physical locations as hot spots;

applying one or more defect detection methods to the stored output corresponding to the first portion of the physical locations to detect defects at the first portion of the physical locations, wherein said applying comprises iteratively applying the one or more defect detection methods to the stored output corresponding to the first portion of the physical locations, comparing the defects detected at the first portion of the physical locations to the bit failures, and changing one or more parameters of the one or more defect detection methods until the defects are detected at the first portion of the physical locations; and generating a wafer inspection process based on the defects detected by the one or more defect detection methods at the first portion of the physical locations, wherein said storing the output, separating, storing the information, applying, and generating are performed with one or more computer systems.

39. A non-transitory computer-readable medium, storing program instructions executable on a computer system for performing a computer-implemented method for generating a wafer inspection process, wherein the computer-implemented method comprises:

storing output of one or more detectors of an inspection system during scanning of a wafer performed to detect defects on the wafer regardless of whether the output corresponds to the defects detected on the wafer;

separating physical locations on the wafer that correspond to bit failures detected by testing of the wafer into a first portion of the physical locations at which the defects were not detected and a second portion of the physical locations at which the defects were detected;

storing information for the first portion of the physical locations as hot spots;

applying one or more defect detection methods to the stored output corresponding to the first portion of the physical locations to detect defects at the first portion of the physical locations, wherein said applying comprises iteratively applying the one or more defect detection methods to the stored output corresponding to the first portion of the physical locations, comparing the defects detected at the first portion of the physical locations to the bit failures, and changing one or more parameters of the one or more defect detection methods until the defects are detected at the first portion of the physical locations; and generating a wafer inspection process based on the defects detected by the one or more defect detection methods at the first portion of the physical locations.

* * * * *